United States Patent

Goat et al.

(10) Patent No.: US 8,058,777 B2
(45) Date of Patent: Nov. 15, 2011

(54) CASING FOR AN ELECTRICAL COMPONENT

(75) Inventors: Christopher A. Goat, Offham (GB); Michael P. Cooke, Gillingham (GB)

(73) Assignee: Delphi Technologies Holdings S.arl, Troy, MI (US)

( * ) Notice: Subject to any disclaimer, the term of this patent is extended or adjusted under 35 U.S.C. 154(b) by 133 days.

(21) Appl. No.: 12/524,171

(22) PCT Filed: Jan. 31, 2008

(86) PCT No.: PCT/IB2008/050366
§ 371 (c)(1), (2), (4) Date: Jul. 23, 2009

(87) PCT Pub. No.: WO2008/093294
PCT Pub. Date: Aug. 7, 2008

(65) Prior Publication Data
US 2010/0025065 A1    Feb. 4, 2010

(30) Foreign Application Priority Data

Feb. 1, 2007  (GB) .................................. 0701823.7

(51) Int. Cl.
*H01L 41/08* (2006.01)

(52) U.S. Cl. .................. 310/340; 310/344; 310/328
(58) Field of Classification Search .................. 310/328, 310/349, 344
See application file for complete search history.

(56) References Cited

U.S. PATENT DOCUMENTS

| | | | |
|---|---|---|---|
| 7,024,737 B2 * | 4/2006 | Schuh et al. .................. 29/25.35 |
| 7,247,975 B2 * | 7/2007 | Tochi et al. .................. 310/328 |
| 7,531,944 B2 * | 5/2009 | Oakley et al. .................. 310/340 |
| 2002/0038713 A1 | 4/2002 | Schuh et al. |
| 2002/0153431 A1 * | 10/2002 | Sato et al. .................. 239/102.1 |
| 2004/0217672 A1 | 11/2004 | Bindig et al. |

FOREIGN PATENT DOCUMENTS

| | | |
|---|---|---|
| JP | 2001-40805 | 2/2001 |
| WO | 03/009400 | 1/2003 |

OTHER PUBLICATIONS

International Search Report dated Jun. 10, 2008.
UK Search and Examination Report dated Feb. 2, 2009.

* cited by examiner

*Primary Examiner* — Mark Budd
(74) *Attorney, Agent, or Firm* — Thomas N. Twomey

(57) ABSTRACT

A casing for encapsulation of an electrical component, for example a piezoelectric actuator, comprising an outer layer of a semipermeable material and an inner layer comprising a chemically active, hydrophilic substance that chemically combines with water to form a compound.

15 Claims, 1 Drawing Sheet

CASING FOR AN ELECTRICAL COMPONENT

FIELD OF THE INVENTION

The present invention relates to a casing for providing a moisture free environment for an electrical component. In particular, the present invention relates to a casing for a piezoelectric element, such as may be used in an actuator arrangement for use in controlling valve needle movement in a fuel injector for a compression ignition engine.

BACKGROUND OF THE INVENTION

It may be necessary to encapsulate a piezoelectric element in order to protect it from potentially damaging environmental conditions. For example, in one known application, described in EP 0 995 901, a piezoelectric element is surrounded with high pressure fuel. However, the fuel and the piezoelectric element must be kept separate in order to prevent any moisture present within the fuel having an electrochemical effect on the compounds in the piezoelectric material.

In many applications, such as that described in EP 0 995 901, the material encapsulating the piezoelectric element must be flexible in order to enable the piezoelectric element to change in length. At present preferred materials for the casing are polymers as these exhibit many desirable characteristics. However, polymers are not an ideal material because they cannot provide a permanent moisture barrier, due to their inherent permeability. Even in the most permeation resistant polymers, such as fluorinated polymers or elastomers, water permeation is significant.

Moisture that has entered the casing of a piezoelectric element at the manufacturing stage can also cause problems. This moisture has the same potential to damage the piezoelectric element as that permeating through the casing and therefore it is desirable to remove it.

SUMMARY OF THE INVENTION

Consequently, there is a need for a casing that provides and maintains a moisture free internal environment while allowing an internally located piezoelectric element to expand and contract.

Certain active metals and metal oxides can be used to remove water from an environment by means of a chemical reaction that results in a stable dielectric substance.

For example, a suitable metal is Calcium, which, when reacted with water, forms Calcium hydroxide and Hydrogen, according to the equation shown below.

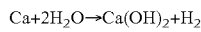

A suitable metal oxide for the outer layer is Calcium oxide, which, when reacted with the water, forms Calcium hydroxide, according to the equation shown below.

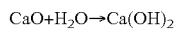

The metals and metal oxides that are most suitable for the removal of water are found in Group 1 and Group 2 of the Periodic Table.

Accordingly, the present invention provides a casing for encapsulation of an electrical component, comprising an outer layer of a semipermeable material and an inner layer comprising a chemically active, hydrophilic, substance that chemically combines with water to form a compound.

In an exemplary embodiment, the outer layer is flexible.

According to a first exemplary embodiment, the inner layer may comprise a metal oxide powder.

In an exemplary embodiment, the metal oxide powder is provided in a loose form, or within a matrix or in a breathable bag.

In an alternative embodiment, the inner layer may comprise a solid metal oxide. This solid metal oxide may be formed by, for example, application of pressure to a loose powder or by fusing a loose powder. In a further alternative embodiment, the metal oxide powder may be mixed with a non-water based binder. If a metal oxide powder in a non-water based binder is utilised for the inner layer then the inner layer can be used to electrically insulate a piezoelectric element. In a still further embodiment a metallic coating layer may be provided on a non-water based binder and metal oxide inner layer.

According to another exemplary embodiment, the inner layer may comprise a metal film.

In accordance with this embodiment, the inner layer may comprise a plurality of metal films. It may be advantageous to use a plurality of films as these may be easier to wrap around a piezoelectric element and offer a better physical barrier to the permeation of water because, if fractures occur in adjacent films they are unlikely to line up and hence, even if such fractures develop, a physical barrier to water will be maintained.

In an exemplary embodiment, at least one polymer film is provided adjacent to at least one metal film.

In an exemplary embodiment, the metal oxide is Calcium oxide. However, any suitably reactive metal oxide may be utilised. For example, any oxide of a metal from Group 1 or Group 2 of the Periodic Table. In addition, other suitable materials may be used, for example Phosporus pentoxide, which forms a viscous liquid phosphoric acid instead of a solid when brought into contact with water.

In an exemplary embodiment, the metal is Calcium. However, any suitably reactive metal may be utilised, for example, Lithium or Strontium, or any other metal from Group 1 or Group 2 of the Periodic Table.

In an exemplary embodiment, the outer layer is made a polymer, for example a fluorinated polymer or elastomer.

BRIEF DESCRIPTION OF THE DRAWINGS

Two additional exemplary embodiments of the present invention will now be described with reference to the accompanying drawings, in which.

BEST MODE FOR CARRYING OUT THE INVENTION

Figure 1:
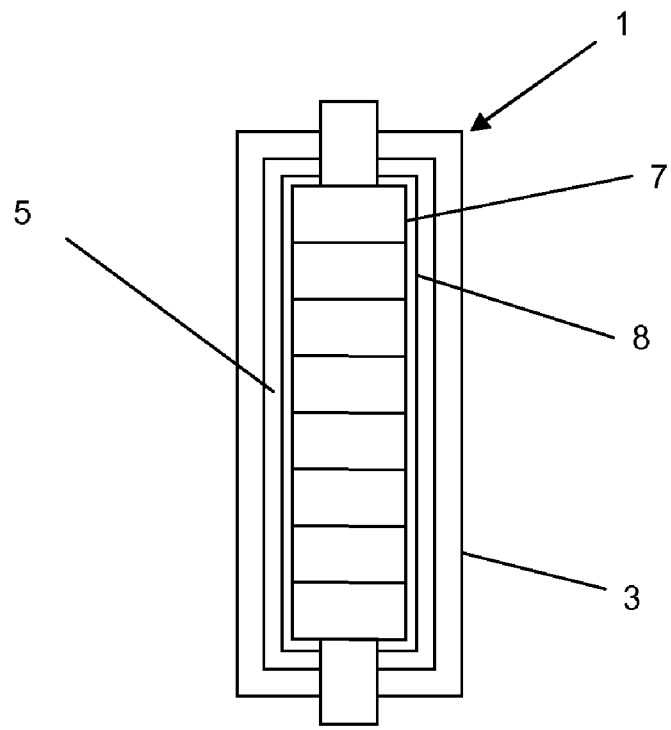
FIG. 1 is a schematic view of an encapsulated piezoelectric element according to a first illustrated exemplary embodiment of the present invention, wherein a layer of Calcium oxide powder is located between the piezoelectric element and the casing.

In the first illustrated exemplary embodiment of the present invention, as illustrated in FIG. 1, encapsulated actuator assembly 1 comprises outer semipermeable fluorinated polymer encapsulation layer 3 and inner layer 5 of a chemically active substance. Inner layer 5 substantially surrounds piezoelectric element 7 that is itself wrapped in thin insulating polymer layer 8.

The chemically active substance is Calcium oxide and is utilised in a loose powder form. Layer 5 of loose powder is located between encapsulation layer 3 and insulating polymer layer 8 surrounding piezoelectric element 7.

Figure 2:
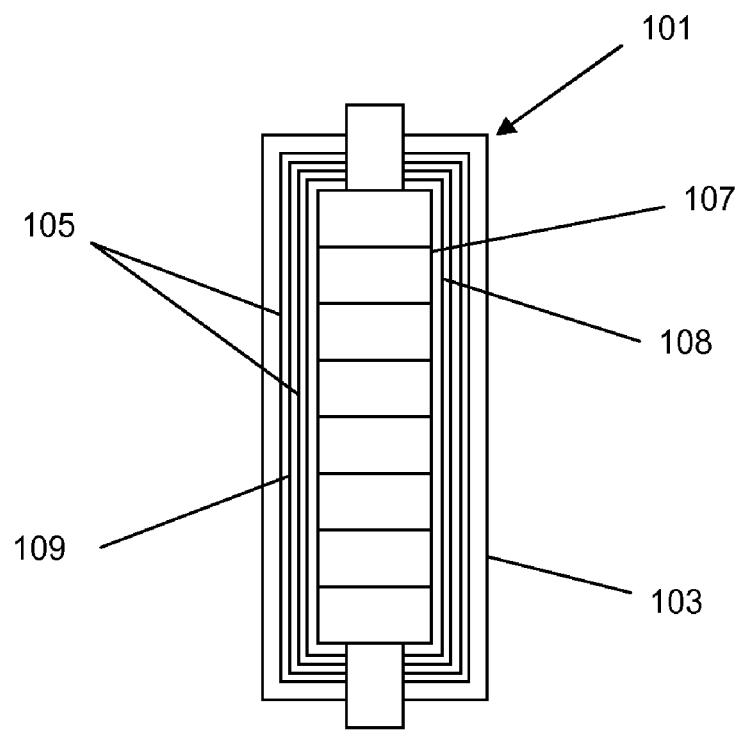
FIG. 2 is a schematic view of an encapsulated piezoelectric element according to a second illustrated exemplary embodiment of the present invention, wherein a layer of Calcium metal film is located between the piezoelectric element and the casing.

In the second illustrated exemplary embodiment of the present invention, as illustrated in FIG. 2, encapsulated actuator assembly 101 comprises outer semipermeable fluorinated polymer encapsulation layer 103 and inner layer of chemically active substance in the form of thin layers 105 of Calcium metal. Layers 105 substantially surround piezoelectric element 107 that is itself wrapped in thin insulating polymer layer 108.

The Calcium metal is utilised as a film and thin film layers 105 are wrapped around insulating polymer layer 108 surrounding piezoelectric element 107.

In addition to the Calcium metal acting as a chemical absorber it functions as a physical barrier to water. To increase the efficacy of this physical barrier, thin polymer layers 109 are provided in between film layers 105. Due to their greater flexibility in comparison to Calcium metal film layers 105, polymer layers 109 act to reduce the likelihood of a breach of the physical barrier by reducing the likelihood of alignment of any fractures that might occur in Calcium metal film layers 105.

Any water, to which actuator assembly 1,101 is subjected, will eventually permeate through external semipermeable polymer encapsulation layer 3,103. Once it has done so, it will come into contact with Calcium oxide layer 5 or Calcium metal layer 105. Similarly, water already present within actuator assembly 1, 101 will come into contact with Calcium oxide layer 5 or Calcium metal layer 105.

Upon contact with Calcium oxide layer 5 or Calcium metal film layers 105, a chemical reaction will occur, and water will be absorbed into a Calcium hydroxide, thereby removing it from the environment within the encapsulation.

The low rate, at which reactive layers 5,105 react with water within actuator assembly 1, 101, means that long term protection of the piezoelectric element can be achieved.

The invention claimed is:

1. A casing for encapsulation of an electrical component, comprising an outer layer of a semipermeable material and an inner layer comprising a chemically active, hydrophilic substance that chemically combines with water to form a compound.

2. A casing as claimed in claim 1, wherein the outer layer is flexible.

3. A casing as claimed in claim 1, wherein the inner layer comprises a metal oxide powder.

4. A casing as claimed in claim 1, wherein the inner layer comprises a loose metal oxide powder, a metal oxide powder within a matrix or a metal oxide powder in a breathable bag.

5. A casing as claimed in claim 1, wherein the inner layer comprises a solid metal oxide.

6. A casing as claimed in claim 1, wherein the inner layer comprises a metal film.

7. A casing as claimed in claim 1, wherein the inner layer comprises a plurality of metal films.

8. A casing as claimed in claim 1, wherein at least one polymer film is provided adjacent to at least one metal film.

9. A casing as claimed in claim 3, wherein the metal oxide is Calcium oxide.

10. A casing as claimed in claim 3, wherein the metal is Calcium.

11. A casing as claimed in claim 1, wherein the outer layer is made from a fluorinated polymer.

12. A casing as claimed in claim 1, wherein the chemically active substance comprises a metal from group 1 or group 2 of the Periodic Table or an oxide of a metal from group 1 or group 2 of the Periodic Table.

13. A casing as claimed in claim 1, wherein the electrical component is a piezoelectric actuator.

14. A casing as claimed in claim 1, further comprising an insulating layer between said electrical component and said hydrophilic substance.

15. A casing as claimed in claim 14, wherein said insulating layer is a polymer.

* * * * *